United States Patent [19]

Simpson

[11] Patent Number: 5,005,193

[45] Date of Patent: Apr. 2, 1991

[54] CLOCK PULSE GENERATING CIRCUITS

[75] Inventor: Richard D. Simpson, Houston, Tex.

[73] Assignee: Texas Instruments Incorporated, Dallas, Tex.

[21] Appl. No.: 374,194

[22] Filed: Jun. 29, 1989

[51] Int. Cl.[5] .......................... H03K 5/19; H03K 21/12
[52] U.S. Cl. ......................................... 377/33; 377/107; 377/75; 377/78; 307/269; 307/470; 307/593; 307/597; 328/119; 328/72
[58] Field of Search .................... 377/30, 33, 107, 110, 377/75, 78; 307/470, 592, 593, 594, 597, 269; 328/72, 119

[56] References Cited

U.S. PATENT DOCUMENTS

| | | | |
|---|---|---|---|
| 3,391,305 | 7/1968 | Bradwin et al. | 377/107 |
| 3,673,390 | 6/1972 | Krebs | 377/33 |
| 4,438,357 | 3/1984 | Wicnienski | 307/597 |
| 4,528,629 | 7/1985 | Breitling | 307/592 |
| 4,763,210 | 8/1988 | Pockrandt | 377/30 |
| 4,797,585 | 1/1989 | Segawa | 307/597 |

Primary Examiner—John S. Heyman
Attorney, Agent, or Firm—William E. Hiller; N. Rhys Merrett; Melvin Sharp

[57] ABSTRACT

A clock generating circuit for use in a signal processing circuit to enable it to be synchronized with other circuits in response to a reset signal uses a multi-state circuit which is cyclically stepped through its states by a clock drive signal and a decoder responsive to the state of the multi-state circuit to produce the required clock pulses. The reset signal is used to stop the multi-state circuit at a particular state and hold it there for a period of time enabling other similar clock pulse generating circuits to reach the same state and be held there. At the end of the period of time the multi-state circuits resume their cyclic stepping with all the circuits in synchronism.

12 Claims, 3 Drawing Sheets

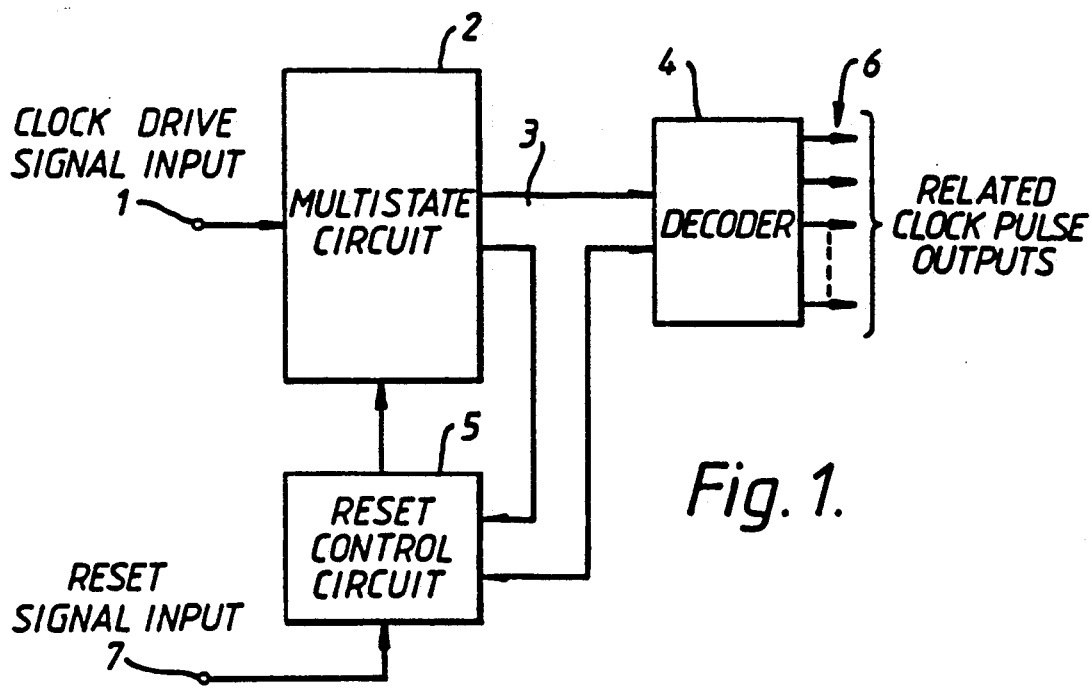
Fig. 1.
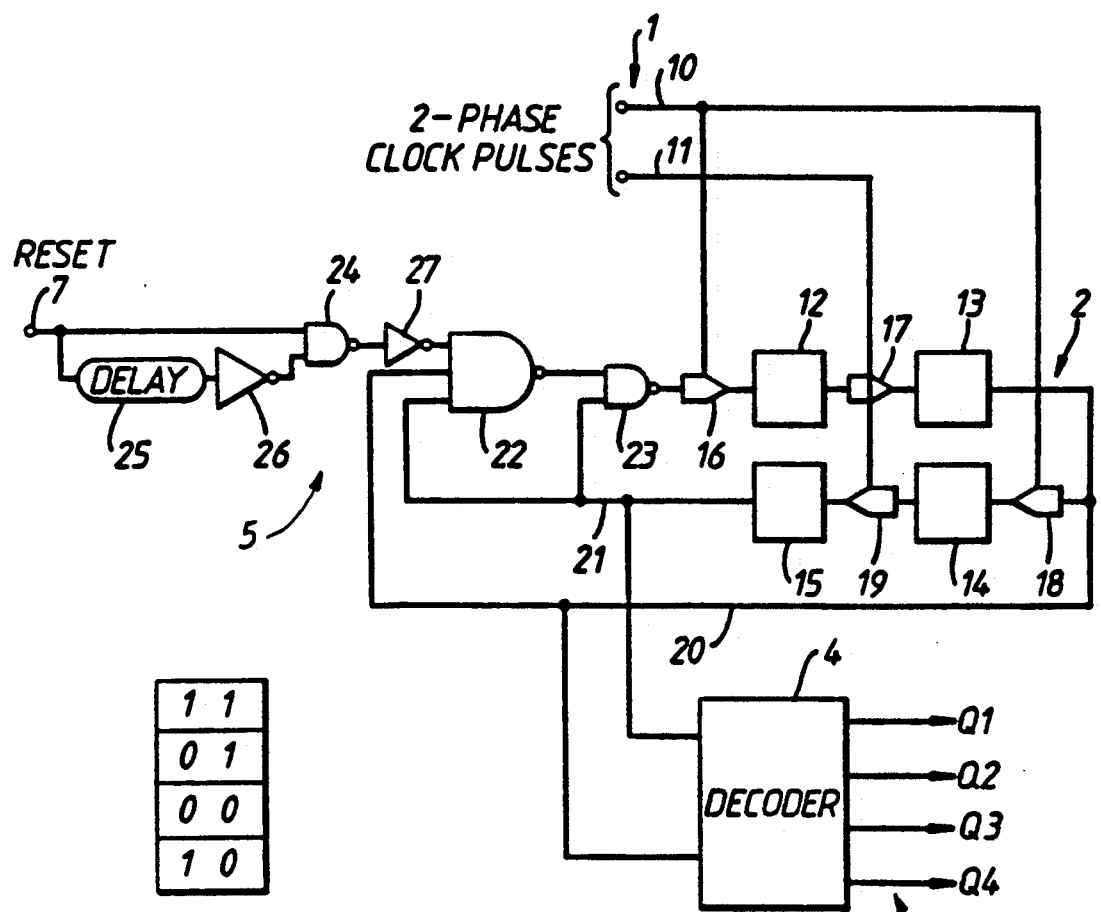
Fig. 3.
Fig. 2.

CLOCK PULSE GENERATING CIRCUITS

This invention relates to clock pulse generating circuits and in particular to such circuits as generate a plurality of related clock signals for synchronising the operations of a complex circuit.

Proposals have been made to produce data processing systems including a plurality of separate processors to enable a plurality of different operations to be performed on the data substantially simultaneously. It is necessary for all these processors to operate synchronously to enable signals generated by one processor to be received and interpreted correctly by another processor. Within each processor it is usual to provide several related clock pulses to time the execution of the operations within the processor, and to provide for the necessary synchronism between the processors it is usual to provide a master clock pulse generator which controls the generation of the different clock pulses within all of the separate processors in the system. To do this it is necessary to stop the clock pulse generation circuitry of each processor in a known phase position and then start all of the clock circuits at the same time. The methods proposed hitherto for achieving this have involved either providing each processor with a special pin dedicated to the synchronising function or providing a special mode of operation of the processors to establish the required synchronism. Both of these methods require a certain amount of additional circuitry external to the processors and therefore add undesirable complexity and cost to the system.

It is an object of the present invention to provide a clock pulse generating circuit which can be reset to a datum phase position and then restarted at a given time in response to a single externally applied signal.

According to one aspect of the present invention there is provided a clock pulse generating circuit including an input for a clock drive signal, a multi-state circuit responsive to the clock drive signal to produce a cyclically repeated sequence of different output combinations of bits, each combination including a plurality of bits, decoding means responsive to the output combinations of the multi-state circuit to produce a plurality of clock pulse outputs corresponding respectively to the different output combinations of the multi-state circuit, and means responsive to a reset signal and to a particular state of the multi-state circuit to block the response of the circuit to the clock drive signal for a period of time The period of time may be of fixed length timed from the start or finish of the reset signal and is at least as long as the time required for the multi-state circuit to execute a complete cycle of its states.

The multi-state circuit may be a shift register having the outputs from two or more stages of the register connected to inputs of a logic circuit the output of which is connected to the start of the shift register. The stages of the shift register from which the outputs are applied to inputs of the logic circuit and the logical operations performed by that circuit are such that the group of bits stored in the shift register is stepped through a cyclically repeated sequence of different combinations of bits as shift pulses derived from the clock drive signal are applied to the shift register.

The logic circuit may include an additional input connected to receive a signal derived from the reset signal so that when the signal is applied to the additional input of the logic circuit the multi-state circuit is able to continue to step through the different combinations of bits until the particular state is reached, when the multi-state circuit is held in that state until the termination of the signal.

In one example the multi-state circuit is a shift register able to store two bits and the multi-state circuit is capable of assuming four different states represented by the four possible different combinations of the two bits. The logic circuit may comprise two NAND-gates, the first gate having three inputs of which two are respectively connected to receive the bits stored in the shift register and the third is connected to receive the signal derived from the reset signal, and the second gate having two inputs, one connected to receive the output of the first gate and the other connected to receive the bit from the final stage of the shift register. This circuit stores sequentially the four different combinations of two bits.

The signal derived from the reset signal may be of a particular logic level for a fixed time duration at least as long as that required for the multi-state circuit to be stepped through the entire cycle of its states by the clock drive signal. The signal may be derived from the leading or the trailing edge of the reset signal.

In another form of the circuit the means responsive to the reset signal blocks the response of the multi-state circuit to the clock drive signal from the first occurrence of the particular state of that circuit following the start of the reset signal until the termination of the reset signal, the reset signal having a duration at least as long as the time required for the multi-state circuit to be stepped through all its states.

The circuit may be constructed from any kind of logic circuitry and may be included in an integrated circuit with a microprocessor. One particular form of microprocessor with which the circuit according to the invention may be incorporated is a graphics system processor chip.

According to a second aspect of the present invention there is provided a data processing system having a plurality of separate processors each including a clock pulse generating circuit, a clock drive pulse generator connected to supply clock drive pulses to all of the processors to operate the clock pulse generating circuits and means for generating a reset signal connected to supply the reset signal to all of the processors for synchronising the operation of the clock pulse generating circuits of the processors, wherein each clock pulse generating circuit includes a multi-state circuit responsive to the clock drive signal to produce a cyclically repeated sequence of different output combinations of bits, each including a plurality of bits, decoding means responsive to the output combinations of the multi-state circuit to produce a plurality of clock pulse outputs corresponding respectively to the different output combinations of the multi-state circuit, and means responsive to the reset signal and to a particular state of the multi-state circuit to block the response of the circuit to the clock drive signal for a period of time.

The period of time may be fixed, timed to start from the start or finish of the reset signal and at least as long as the time required for the multi-state circuit to step through all its states in response to the clock drive signal.

Examples of clock pulse generating circuits embodying the invention will now be described with reference to the accompanying drawings, of which:

FIG. 1 is a block diagram of a clock pulse generating circuit;

FIG. 2 is a diagram of another clock pulse generating circuit in which the multi-state circuit consists of a shift register capable of storing two bits;

FIG. 3 shows the four states which can be assumed by two bits stored in the multi-state circuit shown in the circuit of the FIG. 2;

Figure 4:
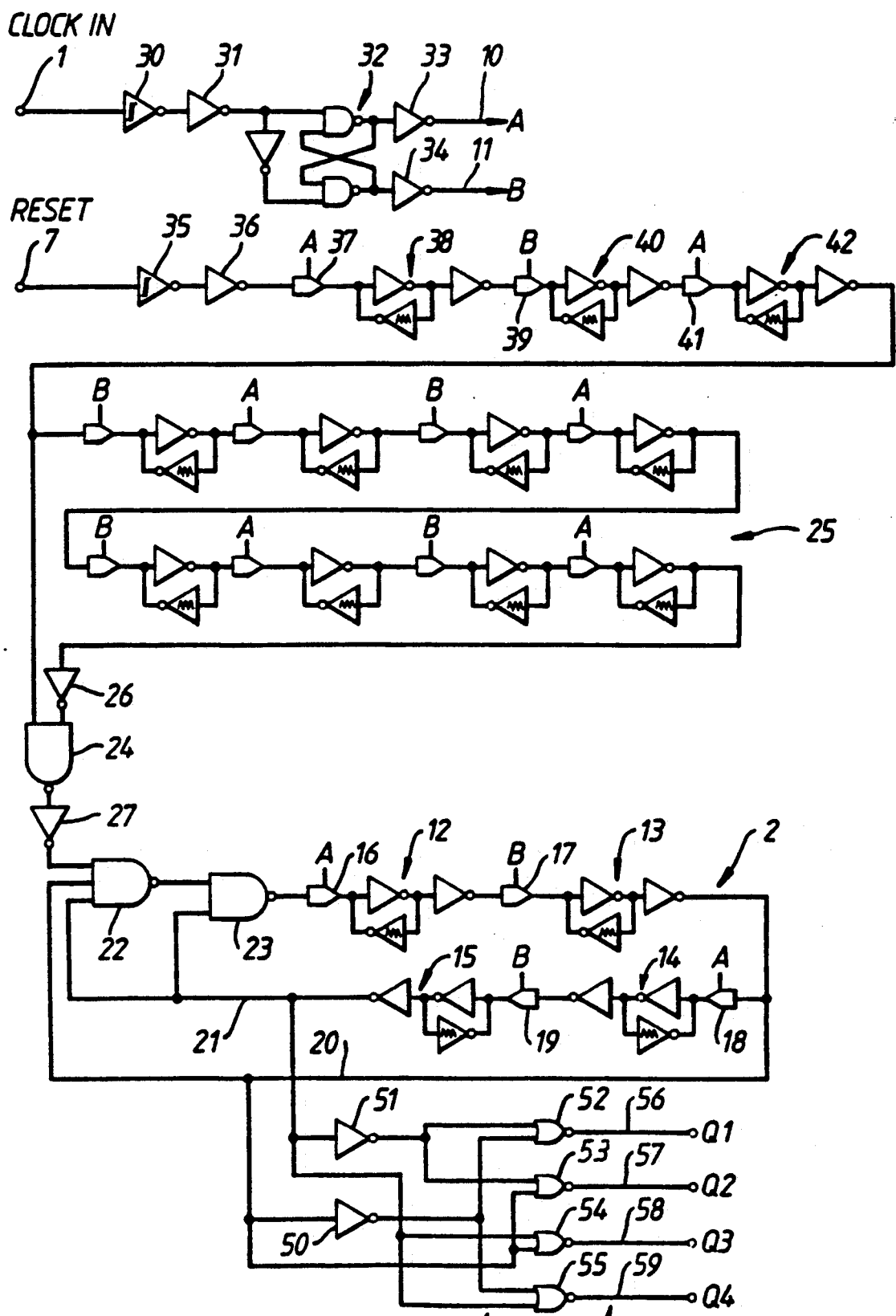
FIG. 4 shows in detail the clock pulse generating circuit of FIG. 2.

In FIG. 1, a clock drive signal, which may, for example, consist of a steady succession of rectangular pulses, is applied through a terminal 1 to the input of a multi-state circuit 2. The multi-state circuit 2 assumes a plurality of different states in sequence in response to successive pulses of the clock drive signal, and the state of the circuit 2 is generated as an output consisting of a number of bits in parallel on a multi-line connection 3. The output of the circuit 2 is applied as an input to a decoder 4 and to a reset control circuit 5. The decoder 4 responds to the different combinations of bits received from the circuit 2 to generate a plurality of clock pulse signals on output conductors 6. The reset control circuit 5 is also connected to receive a reset signal input through a terminal 7 and is connected to apply a control signal to the multi-state circuit 2.

In normal operation the multi-state circuit 2 steps through the cycle of its states in response to the pulses of the clock drive signal applied to the terminal 1 and the decoder 4 responds to the combinations of bits output from the circuit 2 via the lines 3 to generate the related sets to clock pulses on the conductors 6.

When it is required to synchronise the sequence of clock pulses on the conductors 6 with those of another device, a reset signal is applied to the terminal 7, which causes the reset control circuit 5 to detect a particular combination of bits on the lines 3 when it occurs. Until this combination of bits occurs the reset control circuit 5 permits the multi-state circuit 2 to continue with stepping through its states in response to the clock drive signal pulses. When the particular combination of bits does occur in the output of the circuit 2, the reset control circuit 5 applies a signal to the circuit 2 which blocks its further stepping in response to the clock drive signal pulses.

The signal from the reset control circuit 5 has a duration at least as long as the time taken for the multi-state circuit 2 to step through all its states and is arranged to terminate at a predetermined time after either the start or end of the reset signal. This means that if two devices, such as processors, including the circuit of FIG. 1 are required to be brought into synchronism, the multi-state circuit 2 of both of the devices must have reached the particular state which the reset control circuits 5 are arranged to detect before the simultaneous occurrence of the ends of the signals from the reset control circuits 5 in the two devices. The clock pulse generation restarts in both circuits simultaneously in synchronism when the signals from the reset control circuits have ended.

FIG. 2 shows a circuit of the type shown in FIG. 1 in which the multi-state circuit 2 consists of a shift register capable of storing two bits and a logic circuit connected to feed to the input of the register a logical combination of the bits stored in it. In FIG. 2, the components which correspond to the blocks shown in FIG. 1 have the same reference numbers as in that Figure.

The clock drive signals in FIG. 2 consist of two non-overlapping square waves applied to conductors 10 and 11 respectively. The shift register included in the multi-state circuit 2 has two storage elements per bit and uses the clock drive signals on the conductors 10 and 11 as two-phase shift pulses. The storage elements of the shift register are indicated by the blocks 12, 13, 14 and 15 and these are linked by transfer circuits 16, 17, 18 and 19. The signal on a conductor 20 connected to the output of the element 13 represents the first bit stored in the register and a signal on a conductor 21 connected to the output of the element 15 represents the second bit stored in the register. The conductors 20 and 21 are connected to two inputs of a three-input-NAND gate 22 and to the two inputs of the decoder 4. The conductor 21 is also connected to an input of a two-input NAND-gate 23, the second input of which is connected to the output of the three-input NAND-gate 22. The reset signal input terminal 7 is connected directly to an input of a two-input NAND-gate 24 and through a delay circuit 25 and an inverter 26 to the second input of the NAND-gate 24. The output of the NAND-gate 24 is connected through an inverter 27 to the third input of the three-input NAND-gate 22.

When not under the control of a reset signal, the output of the NAND-gate 22 is high so that the NAND-gate 23 acts as a simple inverter of the signal on the conductor 21. As a result, the two bits stored in the shift register formed of the storage elements 12, 13, 14 and 15 and transfer circuits 16, 17, 18 and 19 are stepped through the four possible combinations of two bits as shown in FIG. 3. Because of the two-phase operation of the shift register a clock pulse of each phase is required to step a bit from the elements 12 and 13 into the elements 14 and 15. It follows therefore that a complete cycle of the four states of the shift register takes eight square wave pulses on each of the two-phase clock pulse input conductors 10 and 11. The decoder 4 responds to the pairs of bits appearing on the conductors 20 and 21 to produce clock pulses Q1, Q2, Q3 and Q4 in sequence on the conductors 6, a clock pulse Q2 being produced when the input is 1 1, a clock pulse Q2 being produced when the input is 0 1, a clock pulse Q3 being produced when the input is 0 0, and a clock pulse Q4 being produced when the input is 1 0.

When the terminal 7 is switched to a high level by a reset signal, the output of the NAND-gate 24 goes low because the inverter 26 is already applying a high level signal to the other input of the gate 24. The low at the output of the gate 24 is converted to a high by the inverter 27 which primes the three-input NAND-gate 22 to detect the 1 1 state of the shift register when both conductors 20 and 21 are high. When this happens, the output of the three-input NAND-gate 22 goes low and closes the NAND-gate 23 to the passage of the signals. In this state the output of the NAND-gate 23 is high and the shift register is held in the 1 1 state as long as the output of the NAND-gate 22 is low. This state is maintained until the high level applied to the terminal 7 has passed through the delay circuit 25 when the output of the inverter 26 goes low causing the gate 24 to produce a high output and consequently the output of the inverter 27 to go low so disabling the NAND-gate 22 which then produces a high output and re-opens the NAND-gate 23 permitting the cycling of the states of the shift register again in response to the clock pulses.

Since the emergence of the high level from the output of the delay circuit 25 triggers the restart of the multi-state circuit 2 stepping through its states and renewed generation of clock pulses in response to the outputs of the circuit 2, it is important that the delay time of the circuit 25 be accurately determined. A suitable form of delay circuit for this purpose is a shift register using the clock pulses as shift pulses. As mentioned above, the delay circuit imposed by circuit 25 must be sufficiently long to ensure that the multi-state circuit 2 has reached the state 1 1 before the end of the signal blocking its response to the clock drive signals. It would of course be possible to arrange for the multi-state circuit 2 to be stopped in other states than the state 1 1. In order to achieve this, it would be necessary to provide a different logic circuit from that formed by the NAND-gates 22 and 23 as described above.

FIG. 4 shows in detail the clock pulse generating circuit shown in FIG. 2. In FIG. 4, the parts corresponding to those shown in FIG. 2 have the same reference numerals as in that Figure. Since the operation of FIG. 4 corresponds to that for FIG. 2 as described above, it is not proposed to describe this operation in detail, but only to describe the additional details shown in FIG. 4.

In FIG. 4, the clock drive signals received from the terminal 1 are applied to a level setting inverter 30 which ensures that the high and low states of the clock drive signals correspond to those used by the logic of which the circuit of FIG. 4 is constructed. The clock drive signals are re-erected by a second inverter 31 and are applied to a trigger circuit 32 which produces two non-overlapping square wave clock pulses. These pulses are re-erected by inverters 33 and 34 respectively before they appear on the conductors 10 and 11. To avoid unnecessarily complicating FIG. 4, the two square wave pulse signals are labelled respectively A and B and are connected to operate the transfer circuits which have their control inputs labelled A and B in accordance with the phase of the clock pulses by which they are driven.

The terminal 7 to which the reset signal is applied is connected to a level setting inverter 35, similar to the inverter 30, which is provided for the purpose of setting the high and low levels of the input reset signal to those required by the following circuitry. The output of the inverter 35 is re-erected by an inverter 36 and applied via a transfer circuit 37 controlled by the A phase of the clock pulses to a shift register stage 38. The function of the shift register stage 38 is to store the logic level transferred to it by the circuit 37 for a sufficient length of time for the logic level to be transferred via the next transfer circuit 39 to a second shift register stage 40. The output of the shift register stage 40 is connected through a further transfer circuit 41 to a third shift register stage 42. The shift register stages 38, 40 and 42 are of the same construction, each consisting of a forward inverter the output of which is connected to the input by a feedback inverter having a high impedance output, together with a second inverter connected from the output of the forward inverter for re-erecting the output logic level to that applied to the forward inverter. The function of the feedback inverter is to sustain the logic level applied to the input of the forward inverter, with the qualification that the high output impedance of the feedback inverter permits the logic level at the input of the forward inverter to be changed by the output of a transfer circuit. The function of the succession of shift register stages 38, 40 and 42 is to reduce the possibility that a state intermediate between the low and high logic levels could be applied to the following circuits in response to the transitions of the reset signal, so that when a reset signal is applied to the terminal 7 clean transitions from low to high and from high to low appear shortly afterwards from the output of the stage 42.

The output of the stage 42 is connected directly to an input of the NAND-gate 24 and through the delay circuit 25 and the inverter 26 to the second input of the gate 24. The delay circuit 25 consists of eight shift register stages similar to those described above interconnected by transfer circuits controlled by the clock pulses A and B. The shift register stages of the delay circuit 25 do not include the second inverters because the inversion of the logic level produced by the stage 42 is compensated for by the fact that there are an even number of stages.

The output of the gate 24 is applied through the inverter 27 to the multi-state circuit 2 which is of the form described above with reference to FIG. 2. The shift register stages 12, 13, 14 and 15 are of the same construction as the stages 38, 40 and 42.

The pair of bits appearing on the conductors 20 and 21 are applied to the decoder 4. In the example shown in FIG. 4 of the decoder 4, the conductors 20 and 21 are connected to inputs of NOR-gates 52, 53, 54 and 55, both directly and through inverters 50 and 51, so that the gates 52, 53, 54 and 55 correspond respectively to the four combinations of bits 1 1, 0 1, 0 0 and 1 0. To achieve this, the conductor 20 is connected through the inverter 50 to one input of the gate 52, and the conductor 21 is connected through the inverter 51 to the other input of the gate 52. The inputs of the gate 53 are connected respectively to the output of the inverter 51 and directly to the conductor 20. The inputs of the gate 54 are connected directly to the conductors 20 and 21 respectively, and the inputs of the gate 55 are connected respectively to the output of the inverter 50 and directly to the conductor 21. The clock pulses are generated by the gates 52, 53, 54 and 55 and appear respectively on the conductors 56, 57, 58 and 59 connected to the outputs of those gates. Each train of clock pulses has a high level for one-quarter of a duty cycle and a low level for the remaining three-quarters of that duty cycle. The repetition frequency of the pulses is one-half of that of the clock drive signals applied to the terminal 1.

The circuit may be constructed using any kind of logic circuit technology and must be compatible with the construction and operation of the rest of an integrated circuit where the clock pulse circuit is incorporated in such a circuit. In a particular embodiment the technology used is the so-called dynamic MOS logic technology. In this case, each of the transfer circuits may comprise a single MOS transistor having its source connected to receive the input to the transfer circuit and its drain connected to supply the output from the transfer circuit, with its gate connected to receive the appropriate shift pulse train. Of course, other circuit arrangements may be used to form the transfer circuits.

The multi-state circuit 2 may be constructed to have more than four different states and the decoder must be arranged to respond to such of those states as are required to be used to produce clock pulse signals. It is not essential for all of the possible states of the multi-state circuit to be used by the decoder in producing the clock pulses.

Although as described above with reference to the drawings, the restarting of the changing of the state of the multi-state circuit in response to the clock drive signals takes place at a predetermined time after the start of the reset signal, it would be possible to modify the circuit so that the restarting of the changing of the state is triggered by the trailing edge of the reset signal either synchronously with it or at some predetermined time interval after it. It is necessary to ensure that the changing of the state of the multi-state circuit is blocked for a period sufficient for the multi-state circuits in all of the processors or other devices required to be synchronised to have reached the particular state before the restoration of the changing of state.

Figure 5:
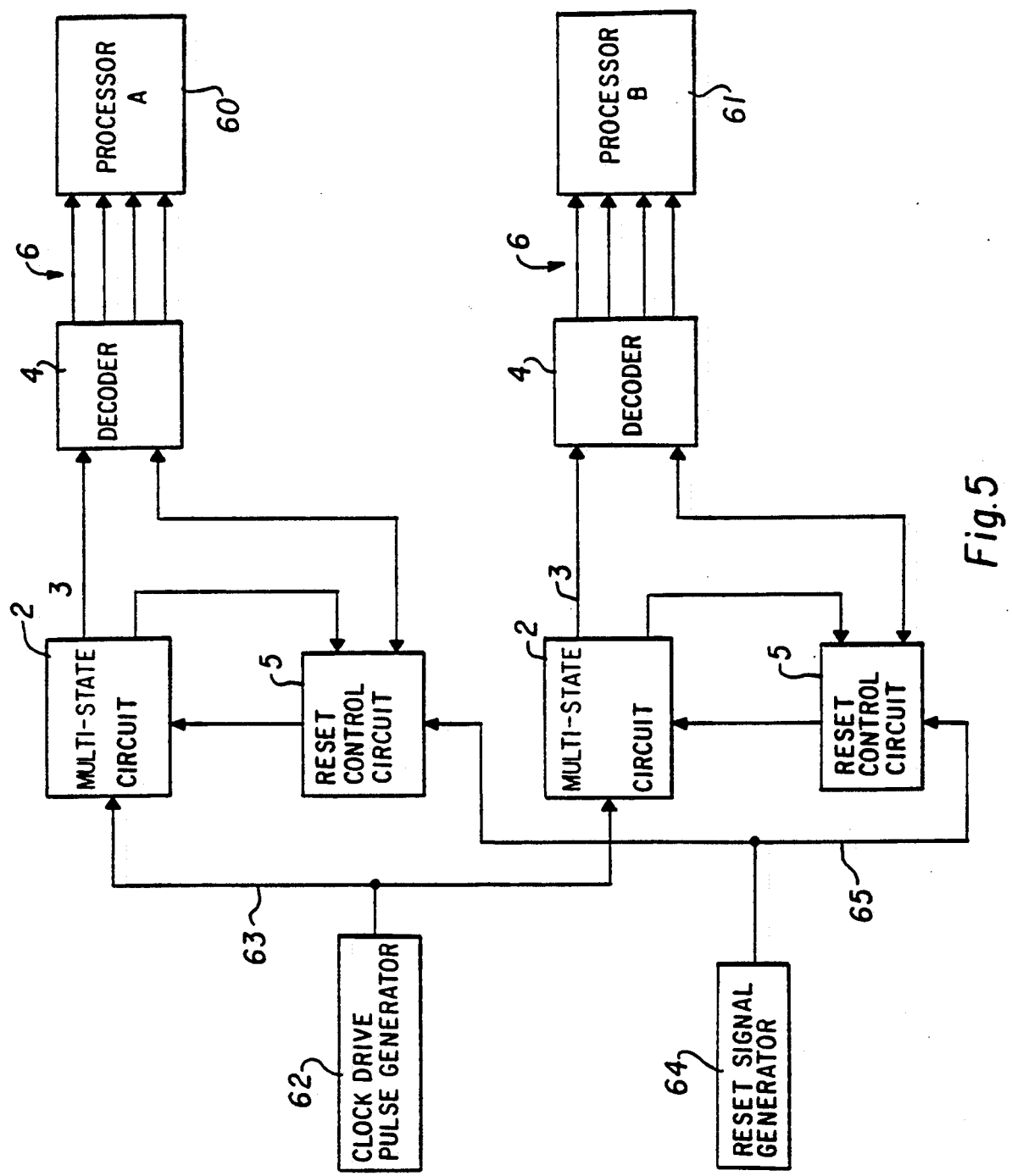
FIG. 5 is a block diagram of a data processing system having separate processors, each of which includes a clock pulse generating circuit as shown in FIG. 1.

In FIG. 5, a data processing system having processor A and processor B as separate processors 60 and 61 respectively is shown. Each of the processors 60 and 61 includes a respective clock pulse generating circuit as illustrated in FIG. 1 and as previously described. The data processing system further includes a clock drive pulse generator 62 connected by a conductor 63 to the multi-state circuits 2 of the clock pulse generating circuits of the respective processors 60 and 61. The clock drive pulse generator 62 thereby supplies clock drive pulses are clock drive signal inputs to each of the processors 60 and 61 for operating the respective clock pulse generating circuits thereof. In addition, a reset signal generator 64 is provided for generating a reset signal, the reset signal generator 64 being connected via a conductor 65 to the respective reset control circuits 5 of the clock pulse generating circuits for the processors 60 and 61. Thus, a reset signal is provided by the reset signal generator 64 via the common conductor 65 to each of the reset control circuits 5 of the clock pulse generating circuits for the respective processors 60 and 61 so as to synchronize the operation of the clock pulse generating circuits of the processors 60 and 61.

I claim:
1. A clock pulse generating circuit comprising:
   an input for a clock drive signal;
   a multi-state circuit responsive to the clock drive signal to produce a cyclically repeated sequence of different output combinations of bits, each combination including a plurality of bits;
   decoding means responsive to the output combinations of the multi-state circuit to produce a plurality of clock pulse outputs corresponding respectively to the different output combinations of the multi-state circuit;
   reset control circuit means interconnected between said multi-state circuit and said decoding means and responsive to a reset signal and to a particular state of the multi-state circuit corresponding to a predetermined output combination of bits from said multi-state circuit to provide a control signal to said multi-state circuit blocking the response of the multi-state circuit to the clock drive signal for a period of time; and
   the multi-state circuit continuing to follow the cyclically repeated sequence of different output combinations of bits until the predetermined output combination of bits corresponding to the particular state of the multi-state circuit is reached, the multi-state circuit in response to the control signal from said reset control circuit means being held in the particular state to which the predetermined output combination of bits corresponds until the control signal from said reset control circuit means is terminated.

2. A clock pulse generating circuit as set forth in claim 1, wherein the period of time during which the response of the multi-state circuit to the clock drive signal is blocked in response to the control signal from said reset control circuit means is of fixed length, the period of time being at least as long as the time required for the multi-state circuit to execute a complete cycle of its cyclically repeated sequence of different output combinations of bits corresponding to the respective states of the multi-state circuit.

3. A clock pulse generating circuit as set forth in claim 1, wherein the multi-state circuit includes a shift register and a logic circuit, said shift register having a plurality of stages, with the outputs of two or more stages of the shift register being connected to inputs of the logic circuit and the output of the logic circuit connected to the start of the shift register; and
   the stages of the shift register from which the outputs are applied to inputs of the logic circuit and the logical operations performed by the logic circuit being such that the group of bits stored by the shift register is stepped through a cyclically repeated sequence of different combinations of bits as shift pulses derived from the clock drive signal are applied to the shift register.

4. A clock pulse generating circuit as set forth in claim 3, wherein the control signal provided by said reset control circuit means in response to a reset signal has a particular logic level for a fixed time duration at least as long as that required for the multi-state circuit to be stepped through the entire cycle of its states by the clock drive signal.

5. A clock pulse generating circuit as set forth in claim 4, wherein the control signal is produced by said reset control circuit means in response to the leading edge of the reset signal.

6. A clock pulse generating circuit as set forth in claim 4, wherein the control signal is produced by said reset control circuit means in response to the trailing edge of the reset signal.

7. A clock pulse generating circuit as set forth in claim 1, wherein said reset control circuit means responsive to the reset signal provides a control signal blocking the response of the multi-state circuit to the clock drive signal from the first occurrence of the predetermined output combination of bits corresponding to the particular state of the multi-state circuit following the initiation of the control signal until the termination of the control signal, the control signal having a duration at least as long as the time required for the multi-state circuit to be stepped through all of its cyclically repeated sequence of different output combinations of bits respectively corresponding to all of the states of the multi-state circuit.

8. A clock pulse generating circuit comprising:
   an input for a clock drive signal;
   a multi-state circuit responsive to the clock drive signal to produce a cyclically repeated sequence of different output combinations of bits, each combination including a plurality of bits, said multi-state circuit including
   a shift register and a logic circuit, said shift register having a plurality of stages, with the outputs of two or more stages of the shift register being connected to inputs of the logic circuit and the output of the logic circuit connected to the start of the shift register, the stages of the shift register from which the outputs are applied to inputs of the logic circuit and the logical operations performed by the logic circuit being such that the group of bits stored by the shift register is stepped through a cyclically repeated sequence of different combinations of bits as shift pulses derived from the clock drive signal are applied to the shift register, the shift register being capable of storing two bits and the multi-state circuit being capable of assuming four different states represented by the four different combinations of two bits, and said logic circuit including two NAND gates, the first of said NAND gates having two inputs respectively connected to the two outputs representing the bits stored in the shift register, and the second of said NAND gates having two inputs respectively connected to receive the output of the first of said NAND gates and the output representing the bits stored in the second stage of the shift register;

decoding means responsive to the output combinations of the multi-state circuit to produce a plurality of clock pulse outputs corresponding respectively to the different output combinations of the multi-state circuit; and means responsive to a reset signal and to a particular state of the multi-state circuit to block the response of the multi-state circuit to the clock drive signal for a period of time.

9. A clock pulse generating circuit as set forth in claim 8, wherein the first of said NAND gates includes a third input connected to receive a control signal derived from the reset signal.

10. A data processing system comprising:

a plurality of separate processors, each of said processors including a clock pulse generating circuit;

a clock drive pulse generator connected to the respective clock pulse generating circuits of each of said plurality of processors for supplying clock drive pulses as a clock drive signal input to each of said plurality of separate processors to operate the clock pulse generating circuits thereof; and a reset signal generator connected to the clock pulse generating circuits of each of said plurality of processors for generating a reset signal supplied to each of said processors for synchronizing the operation of the clock pulse generating circuits of the processors;

each clock pulse generating circuit including a multi-state circuit responsive to the clock drive signal from said clock drive pulse generator to produce a cyclically repeated sequence of different output combinations of bits, each combination including a plurality of bits, decoding means responsive to the output combinations of the multi-state circuit to produce a plurality of clock pulse outputs corresponding respectively to the different output combinations of the multi-state circuit, reset control circuit means interconnected between said multi-state circuit and said decoding means and connected to said reset signal generator, said reset control circuit means being responsive to a reset signal as produced from said reset signal generator and to a particular state of the multi-state circuit corresponding to a predetermined output combination of bits from said multi-state circuit to provide a control signal to said multi-state circuit blocking the response of the multi-state circuit to the clock drive signal for a period of time, and the multi-state circuit continuing to follow the cyclically repeated sequence of different output combinations of bits until the predetermined output combination of bits corresponding to the particular state of the multi-state circuit is reached, the multi-state circuit in response to the control signal from said reset control circuit means being held in the particular state to which the predetermined output combination of bits corresponds until the control signal from said reset control circuit means is terminated.

11. A data processing system as set forth in claim 10, wherein the period of time during which the response of the multi-state circuit to the clock drive signal is blocked in response to the control signal from said reset control circuit means is of fixed length, is timed to start from the start or finish of the control signal, and is at least as long as the time required for the multi-state circuit to execute a complete cycle of its cyclically repeated sequence of different output combinations of bits corresponding to the respective states of the multi-state circuit.

12. A data processing system as set forth in claim 10, wherein said reset control circuit means responsive to the reset signal provides a control signal blocking the response of the multi-state circuit to the clock drive signal from the first occurrence of the predetermined output combination of bits corresponding to the particular state of the multi-state circuit following the initiation of the control signal until the termination of the control signal, the control signal having a duration at least as long as the time required for the multi-state circuit to be stepped through all of its cyclically repeated sequence of different output combinations of bits respectively corresponding to all of the states of the multi-state circuit.

* * * * *